(12) United States Patent
Lu et al.

(10) Patent No.: US 11,103,867 B2
(45) Date of Patent: Aug. 31, 2021

(54) LOCALIZED SURFACE MODIFICATION FOR MICROFLUIDIC APPLICATIONS

(71) Applicant: International Business Machines Corporation, Armonk, NY (US)

(72) Inventors: Minhua Lu, Mohegan Lake, NY (US); Mareva B. Fevre, Oakland, CA (US); James Hedrick, Pleasanton, CA (US); Vince Siu, Thornhill (CA); Evan Colgan, Montvale, NJ (US); Myron Plugge, Enschede (NL)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 15/841,215

(22) Filed: Dec. 13, 2017

(65) Prior Publication Data
US 2019/0176147 A1    Jun. 13, 2019

(51) Int. Cl.
*C07F 7/18* (2006.01)
*B81C 1/00* (2006.01)
(Continued)

(52) U.S. Cl.
CPC .... *B01L 3/502707* (2013.01); *B81C 1/00071* (2013.01); *B81C 1/00119* (2013.01);
(Continued)

(58) Field of Classification Search
None
See application file for complete search history.

(56) References Cited

U.S. PATENT DOCUMENTS 4,891,241 A * 1/1990 Hashimoto ......... C03C 17/3405
427/520
4,965,026 A 10/1990 Janssen
(Continued)

FOREIGN PATENT DOCUMENTS

JP    2009162658 A    7/2009
JP    2016094507 A    5/2016
WO   WO03000748 A1   1/2003

OTHER PUBLICATIONS

Kang, Hyun Uk et al, "Material and rheological properties of (glycidoxypropyl) trimethoxysilane modified colloidal silica coatings," Dec. 2004, Korea-Australia Rheology Journal, vol. 16, No. 4, 175-182 (Year: 2004).*

(Continued)

*Primary Examiner* — Jill A Warden
*Assistant Examiner* — Brittany I Fisher
(74) *Attorney, Agent, or Firm* — Kristofer Haggerty; Michael J. Chang, LLC

(57) ABSTRACT

Techniques for localized surface modification for microfluidic applications are provided. In one aspect, a method includes: contacting at least one portion of a surface with at least one tri(m)ethoxysilane-containing solution under conditions sufficient to form at least one silane monolayer having a given contact angle on the surface thereby modifying a flow rate over the surface. The silane monolayer can include a silane derivative selected from: trimethoxysilylpropoxypolyethyleneoxide (TMS-PPEO), hexadecyl-triethoxysilane (HD-TES), tridecafluoro-1,1,2,2-tetrahydrooctyl)triethoxysilane (TDF-THO-TES), and combinations thereof. A device modified in accordance with the present techniques is also provided.

15 Claims, 11 Drawing Sheets

(51) Int. Cl.
  *C08G 63/183* (2006.01)
  *B01L 3/00* (2006.01)
(52) U.S. Cl.
  CPC ........ *B81C 1/00206* (2013.01); *C07F 7/1804* (2013.01); *C08G 63/183* (2013.01); *B81B 2201/058* (2013.01); *B81C 2201/0188* (2013.01)

(56) References Cited

U.S. PATENT DOCUMENTS

| | | | |
|---|---|---|---|
| 6,369,168 B1 | 4/2002 | Al-Lamee et al. | |
| 6,841,193 B1 | 1/2005 | Yang et al. | |
| 8,048,437 B2 | 11/2011 | Nilsson et al. | |
| 8,252,732 B2 | 8/2012 | Al-Lamee et al. | |
| 8,309,364 B2 | 11/2012 | Miller et al. | |
| 8,802,027 B2 | 8/2014 | Abate et al. | |
| 2005/0255514 A1* | 11/2005 | De Palma | B82Y 30/00 435/6.12 |
| 2009/0012208 A1 | 1/2009 | Madsen et al. | |
| 2014/0252915 A1* | 9/2014 | Su | H01L 41/333 310/311 |
| 2016/0229884 A1* | 8/2016 | Indermuhle | C12Q 1/6834 |
| 2016/0320389 A1 | 11/2016 | Astier et al. | |
| 2017/0297018 A1* | 10/2017 | Rijo da Costa Carvalho | G03F 7/0755 |

OTHER PUBLICATIONS

Herzer, Nicole et al, "Fabrication of patterned silane based self-assembled monolayers by photolithography and surface reactions on silicon-oxide substrates," May 28, 2010, The Royal Society of Chemistry, 46, 5634-5652 (Year: 2010).*

Ortiz et al., "Poly(methyl methacrylate) Surface Modification for Surfactant-Free Real-Time Toxicity Assay on Droplet Microfluidic Platform," ACS Applied Materials Interfaces, 2017, 9 (15), pp. 13801-13811 (Apr. 4, 2017).

Shaurya Prakash, "Surface-Modified Microfluidics and Nanofluidics," https://msns.osu.edu/sites/msns.osu.edu/files/uploads/encynanotech_surface20modified20microfluidics20and20nanofluidics.pdf. (5 total pages).

Soper et al., "Surface modification of polymer-based microfluidic devices," Analytica Chimica Acta 470 (Oct. 2002) pp. 87-99.

Bashir et al., "Hydrophilic Surface Modification of PDMS Microchannel for O/W and W/O/W Emulsions," Micromachines Sep. 2015, 6, 1445-1458; doi:10.3390/mi6101429.

Vladisavuević et al., "Microfluidic Production of Multiple Emulsions," Micromachines Mar. 2017, 8, 75; doi:10.3390/mi8030075 (34 total pages).

English translation of JP2009162658A Jul. 23, 2009 Takahashi Shotaro (7 pages).

English translation of JP2016094507A May 26, 2016 Nakayama Hiroshi (7 pages).

English translation of WO03000748A1 Jan. 3, 2003 Servat, et al. (11 pages).

* cited by examiner

|  | 70°C | 90°C | 110°C | 130°C |
|---|---|---|---|---|
| HD-TES | 88.5° ± 6.1 | 97.8° ± 1.0 | — | — |
| TDF-THO-TES | 65.9° ± 4.7 | 102.0° ± 2.7 | 111.4° ± 2.7 | 122.0° ± 2.4 |
| TMS-PPEO | — | — | 41.0° ± 2.9 | 43.2° ± 1.1 |
FIG. 16
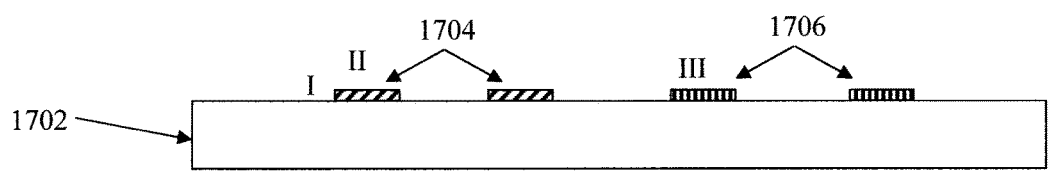
FIG. 17
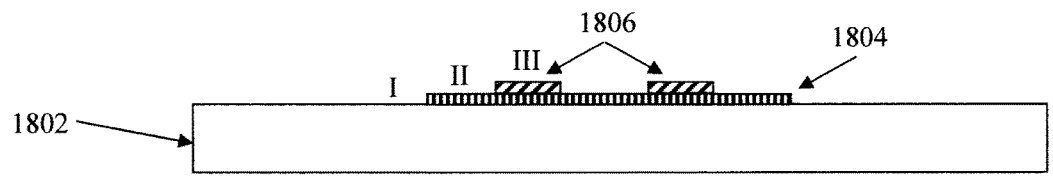
FIG. 18
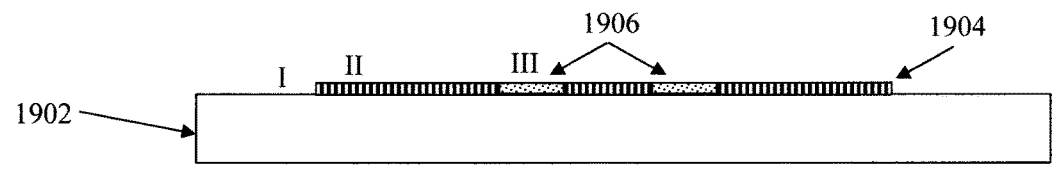
FIG. 19

US 11,103,867 B2

LOCALIZED SURFACE MODIFICATION FOR MICROFLUIDIC APPLICATIONS

FIELD OF THE INVENTION

The present invention relates to fluidic diagnostic devices, and more particularly, to techniques for localized surface modification for microfluidic applications.

BACKGROUND OF THE INVENTION

Diagnostics play a critical role for the detection and prevention of diseases or health-related conditions and for the follow-up or daily care of chronic diseases. Diagnostic tools are used for instance to detect proteins, hormones, pathogens, toxins or metabolites for patients suffering from chronic cardiac diseases, diabetes, infections or allergies, just to name a few. However, the amount of reliable and accurate point-of-care diagnostics available to patients for home therapy or to medical personal in remote locations is somehow limited, with most of the more complicated tests being performed using more sophisticated techniques/equipment in clinical labs.

Several strategies have been explored to bring quantitative and precise point-of-care diagnostics outside of clinical labs. For instance, capillary-driven microfluidics have been developed that allow for easy-to-use but sophisticated and accurate microfabricated diagnostic devices. See, for example, U.S. Patent Application Publication Number 2016/0320389 by Astier et al., entitled "Immunoassay for Detection of Virus-Antibody Nanocomplexes in Solution by Chip-Based Pillar Array." Such devices exhibit several advantages: (i) no need for an energy source as the analytes are passively flowing in the device, (ii) they are simple to use and only require a small amount of sample (nano to tens of microliter scale), (iii) potentially would allow for reproducible and quantitative analysis.

With fluidic devices, the control of the flow of analytes (delay, stop, turn, mixing of different solutions, etc. . . . ) is an important component to successfully conduct assays in such a diagnostic chip. Although the use of polymeric substrates/materials (i.e., as opposed to a semiconductor wafer) to prepare such chips is advantageous in terms of cost and flexibility of the chip, they require surface modification to allow for adequate flow control. The limited stability of the surface modification is often detrimental to the long term storage, quality and reproducibility of the chips' performances.

Therefore, improved techniques for surface modification of fluidic devices would be desirable.

SUMMARY OF THE INVENTION

The present invention provides techniques for localized surface modification for microfluidic applications. In one aspect of the invention, a method is provided. The method includes: contacting at least one portion of a surface with at least one tri(m)ethoxysilane-containing solution under conditions sufficient to form at least one silane monolayer having a given contact angle on the surface thereby modifying a flow rate over the surface. The silane monolayer can include a silane derivative selected from: trimethoxysilyl-propoxypolyethyleneoxide (TMS-PPEO), hexadecyl-triethoxysilane (HD-TES), tridecafluoro-1,1,2,2-tetrahydrooctyl triethoxysilane (TDF-THO-TES), and combinations thereof.

In another aspect of the invention, another method is provided. The method includes: contacting at least one portion of a surface with a tri(m)ethoxysilane-containing solution; exposing the at least one portion of the surface to ultraviolet (UV) radiation to form at least one silane monolayer having a given contact angle on the surface thereby modifying a flow rate over the surface, wherein the at least one silane monolayer comprises a silane derivative selected from the group consisting of: TMS-PPEO, HD-TES, TDF-THO-TES, and combinations thereof.

In yet another aspect of the invention, a device is provided. The device includes: at least one silane monolayer on at least one portion of at least one surface of a material, the at least one silane monolayer having a given contact angle that modifies a flow rate over the surface, wherein the at least one silane monolayer includes a silane derivative selected from: TMS-PPEO, HD-TES, TDF-THO-TES, and combinations thereof.

A more complete understanding of the present invention, as well as further features and advantages of the present invention, will be obtained by reference to the following detailed description and drawings.

BRIEF DESCRIPTION OF THE DRAWINGS

FIG. 16 is a diagram illustrating contact angle of silane derivatives based on reaction temperature according to an embodiment of the present invention;

FIG. 17 is a diagram illustrating a first silane monolayer having been locally coated on a first portion of a substrate surface, and a second silane monolayer having been locally coated on a second portion of the substrate surface according to an embodiment of the present invention;

FIG. 18 is a diagram illustrating a first silane monolayer having been locally coated on a portion of a substrate surface, and a second silane monolayer having been locally coated on top of a portion of the first silane monolayer as an overlayer according to an embodiment of the present invention;

FIG. 19 is a diagram illustrating the contact angle of select regions of a blanket silane monolayer having been tuned according to an embodiment of the present invention;

DETAILED DESCRIPTION OF PREFERRED EMBODIMENTS

Provided herein are techniques for chemical surface modification via silane derivatives to locally tune the contact angle of devices for fluidic applications such as fluidic chips for sample testing and diagnostics. Tuning of the contact angle of surfaces along the flow path of a fluid through the device can be used to control the flow path or paths, the flow rate along the flow paths, etc. Advantageously, being able to tune the contact angle locally (at specific locations on the surface) provides a variety of different possible configurations for fluid flow across the surfaces of the device. For instance, as will be described in detail below, the present techniques can be used to create unique diagnostic testing structures having (localized) regions with differing surface flow rates.

Reference may be made herein to fluidic (i.e., fluid carrying) channels as micro-channels and/or nano-channels based on the dimensions (e.g., diameter) of the channels. While the distinction between what dimensions are considered "micro" and "nano" is somewhat arbitrary, these terms are used herein to indicate channels of different size scale. By way of example only, a micro-channel can be a fluidic channel having a diameter of from about 10 micrometers (μm) to about 2 millimeters (mm), and ranges therebetween, whereas a nano-channel might be a fluidic channel having a width of from about 100 nanometers (nm) to about 10 μm, and ranges therebetween.

The term "contact angle," as used herein, refers to the angle at which a liquid/vapor interface meets a solid surface. Contact angle relates to wettability where a smaller contact angle indicates greater wettability, and vice versa. This concept applies to the flow rates across a surface. For instance, a fluid flows across a surface with a first contact angle (CA1) at a rate R1. If the contact angle of the surface is decreased to a second CA2 (wherein CA1>CA2), then the flow rate of the fluid across the surface will increase, e.g., to a rate R2, wherein R2>R1. Conversely, increasing the contact angle serves to decrease the flow rate across the surface.

Figure 1:
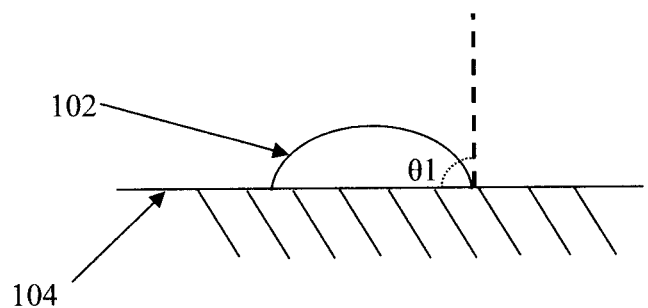
FIG. 1 is a diagram illustrating a liquid present on a solid surface having a contact angle θ1 of about 90 degrees according to an embodiment of the present invention.
Figure 2:
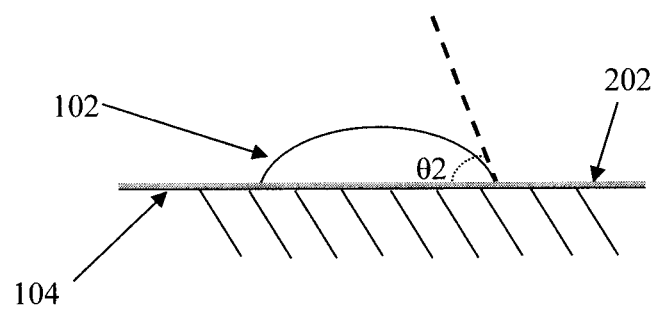
FIG. 2 is a diagram illustrating the surface having been functionalized with a compound that decreases contact angle to θ2, wherein θ1>θ2 according to an embodiment of the present invention.
Figure 3:
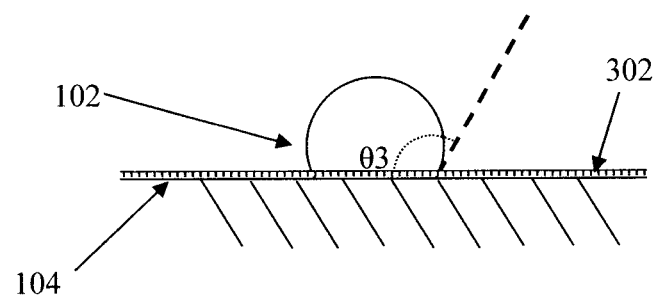
FIG. 3 is a diagram illustrating the surface having been functionalized with a different compound that increases contact angle to θ3, wherein θ3>θ1>θ2 according to an embodiment of the present invention.

A simple example is provided in FIGS. 1-3 to illustrate the concept of contact angle tunability. In FIG. 1, for instance, a liquid 102 present on a solid surface 104 has a contact angle θ1 of about 90 degrees. Notable to the present techniques, one factor impacting contact angle is the properties of the surface 104. For instance, if the surface 104 is functionalized with a compound 202 that decreases contact angle, then the result will be a contact angle θ2, wherein θ1>θ2. See FIG. 2. On the other hand, if the surface 104 is functionalized with a compound 302 that increases contact angle, then the result will be a contact angle θ3, wherein θ3>θ1>θ2. See FIG. 3.

According to an exemplary embodiment, contact angle tuning via the present techniques is carried out via surface chemical modification using silane derivatives. By properly choosing the silane substituents, both long term stability and tuneable contact angles can be achieved.

Figure 4:
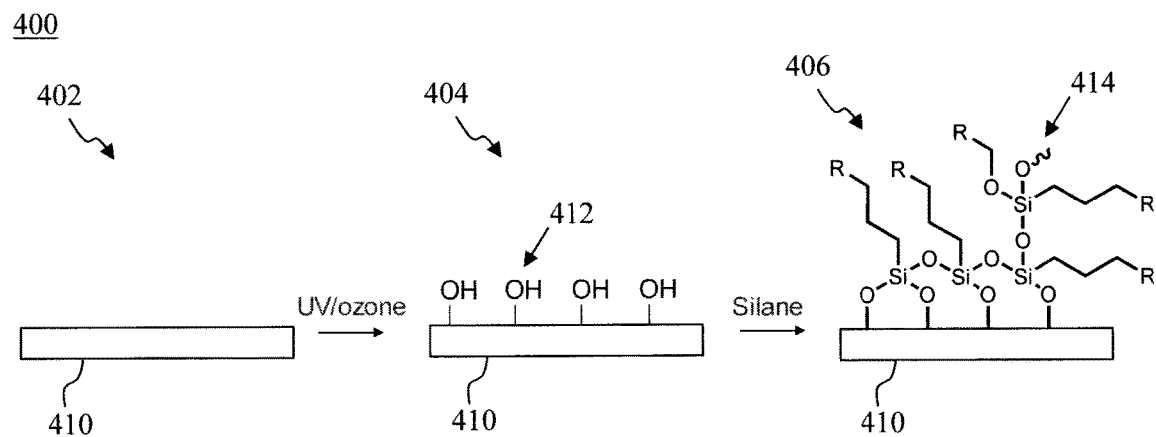
FIG. 4 is a diagram illustrating an exemplary methodology for modifying a surface through the condensation of silane derivatives to locally tune the contact angle at the surface according to an embodiment of the present invention.

For instance, FIG. 4 is a diagram illustrating an exemplary methodology 400 in accordance with the present techniques for modifying a surface through the condensation of silane derivatives to locally tune the contact angle at the surface. In the present example, the surface modifications are being performed on a surface or surfaces of a polymeric substrate 410. By way of example only, the polymeric substrate 410 can be a substrate in which one or more micro-/nano-fluidic channels have been patterned, and the present techniques are employed to control the flow of fluids through those fluidic-channels (see for example FIG. 19, described below). Alternatively, the polymeric substrate 410 can include an open pool into which one or more fluids flow. The present techniques can be employed to ensure that there is an even flow of fluids entering the open pool to prevent air bubbles (see for example FIGS. 20A and 20B, described below). Further yet, the polymeric substrate 410 can provide a surface across which a 'virtual' fluidic channel or channels is formed between regions having a high contact angle (see for example FIGS. 21-23, described below. Suitable polymeric substrates 410 include, but are not limited to, polyethylene terephthalate (PET).

As shown in step 404, an ultraviolet (UV)/Ozone treatment is performed to allow for the formation of hydroxyl moieties 412 at the surface of the substrate 410. According to an exemplary embodiment, this hydroxylation process involves first ozonating the surface of substrate 410 by contacting the surface with ozone (e.g., in a carrier gas) to form hydroperoxy groups on the surface. The ozonated surface is then irradiated with UV light to convert the hydroperoxy groups to hydroxyl moieties 412. This UV/ozone treatment for hydroxylation is described, for example, in U.S. Pat. No. 4,965,026 issued to Janssen, entitled "Process for Hydroxylating Hydrophobic Polymer Surfaces," the contents of which are incorporated by reference as if fully set forth herein.

Reactive ion etch (RIE) may also be used to prepare PET surfaces for silane condensation. RIE creates micro-scale roughening on the PET surface which facilitates adhesion of the silane monolayer to the surface.

Figures 5, 6, 7:
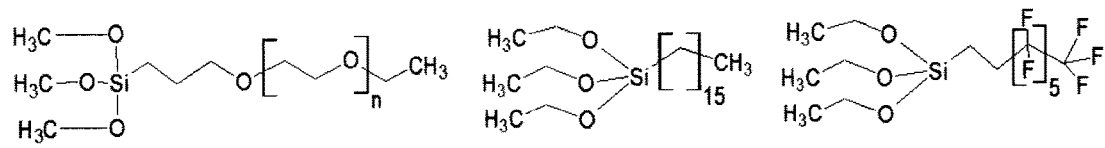
FIG. 5 is a diagram illustrating an exemplary tri(m)ethoxysilanes, i.e., trimethoxysilyl-propoxypolyethyleneoxide (TMS-PPEO), used for surface modification according to an embodiment of the present invention.
FIG. 6 is a diagram illustrating another exemplary tri(m)ethoxysilanes, i.e., hexadecyl-triethoxysilane (HD-TES), used for surface modification according to an embodiment of the present invention.
FIG. 7 is a diagram illustrating yet another exemplary tri(m)ethoxysilanes, i.e., tridecafluoro-1,1,2,2-tetrahydrooctyl)triethoxysilane (TDF-THO-TES), used for surface modification according to an embodiment of the present invention.

Next, commercially available silane modifiers 414 are condensed at the surface of the substrate 410 via the hydroxyl moieties (or RIE-prepped surface), forming at least one silane monolayer (i.e., a layer one molecule thick) on at least one portion of the surface (i.e., as will be described in detail below the condensation can be performed locally and can optionally involve more than one silane derivative). See step 406. After the condensation of the silane monolayer, the substrate 410 is rinsed in ethanol to remove excess unreacted solution and the silane is then cured at an elevated temperature, such as from about 110° C. to about 130° C., and ranges therebetween (e.g., at about 120° C.) in nitrogen. An R-group is used in step 406 to indicate that a variety of different silanes can be formed as surface modifiers in accordance with the present techniques. For instance, in order to obtain a wide range of properties for the modified surfaces, according to an exemplary embodiment three tri (m)ethoxysilanes were selected, i.e., trimethoxysilyl-propoxypolyethyleneoxide (TMS-PPEO), hexadecyl-triethoxysilane (HD-TES) and/or tridecafluoro-1,1,2,2-tetrahydrooctyl)triethoxysilane (TDF-THO-TES). See FIG. 5, FIG. 6 and FIG. 7, respectively. It is notable, however, that the range of silanes can be extended to other substituents, depending on the surface modification process and expected contact angles.

Figure 8:
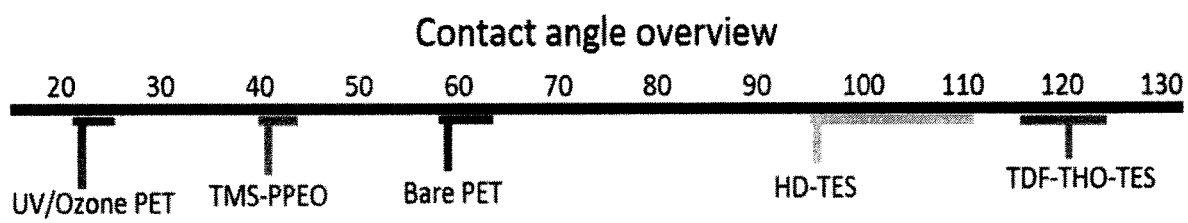
FIG. 8 is a diagram illustrating exemplary contact angles of substrates modified by the condensation of TMS-PPEO, HD-TES, and TDF-THO-TES according to an embodiment of the present invention.

FIG. 8 is a diagram illustrating exemplary contact angles of (in this case PET) substrates modified by the condensation of the above-referenced tri(m)ethoxysilanes, i.e., TMS-PPEO, HD-TES, and TDF-THO-TES. As shown in FIG. 8, modifying a PET substrate surface with TDF-THO-TES generates a contact angle of from about 115 degrees (°) to about 125°, and ranges therebetween. PET substrates modified with HD-TES showed a contact angle of from about 95° to about 110°, and ranges therebetween, while those modified with TMS-PPEO exhibit a contact angle of from about 40° to about 45°, and ranges therebetween.

As also shown in FIG. 8, chemical functionalization with TMS-PPEO lowers the contact angle from that of a bare FET substrate (which itself has a contact angle of from about 58° to about 63°, and ranges therebetween). A UV/ozone-treated PET substrate has a contact angle of from about 22° to about 25°, and ranges therebetween.

According to an exemplary embodiment, the present techniques are leveraged to tune the contact angle of surfaces locally, thereby creating unique surface modifications for fluidic devices that locally alter the surface flow rates of the devices. See, for example, methodology 900 of FIG. 9 for modifying a surface for fluidic applications whereby silane derivatives are used to locally tune the contact angle and thereby control the fluid flow across the surface. As provided above, the surface being modified might be that of a polymeric substrate (such as a PET substrate) and the surface modifications are being performed to fluidic channels or other structure (such as open pool areas) patterned in the substrate and/or to create 'virtual' fluidic channels across the surface of the substrate. In methodology 900, the contact angle is locally tuned by the selective placement of the silane monolayer and/or by controlling reaction temperature and/or duration (e.g., locally). In another exemplary embodiment described in conjunction with the description of methodology 1000 of FIG. 10 below, the contact angle of the surface is modified using a (local) UV curing process.

In order to prepare the surface for silane modification, in step 902 hydroxylation is used to form hydroxyl groups at the surface of the substrate. As provided above, this hydroxylation process can be carried out using a UV and ozone surface treatment by first ozonating the surface by contacting the surface with ozone (e.g., in a carrier gas) to form hydroperoxy groups on the surface. The ozonated surface is then irradiated with UV light to convert the hydroperoxy groups to hydroxyl moieties. As shown in FIG. 8 (described above), this treatment can affect the contact angle (compare contact angle of UV/Ozone PET versus Bare PET). Thus, according to one exemplary embodiment, the hydroxylation is performed selectively on those surfaces that will receive silane modification. For instance, those areas of the surface not receiving treatment can be blocked or masked prior to performing step 902. Alternatively, the entire surface can be treated in step 902 to permit subsequent silane modification to be performed anywhere on the (fully hydroxylated) surface. As an alternative to UV/Ozone treatment, reactive ion etching (RIE) can be used to prepare the surface for silane modification.

In step 904, at least one tri(m)ethoxysilane-containing solution is contacted with at least a portion of at least one surface of the fluidic device under conditions sufficient to form at least one silane monolayer having a given contact angle on the surface thereby modifying a flow rate over the surface. Suitable a tri(m)ethoxysilanes were provided above, e.g., trimethoxysilyl-propoxypolyethyleneoxide (TMS-PPEO), hexadecyl-triethoxysilane (HD-TES) and/or tridecafluoro-1,1,2,2-tetrahydrooctyl)triethoxysilane (TDF-THO-TES). According to an exemplary embodiment, the solution(s) include the tri(m)ethoxysilane dissolved in a solvent such as ethanol.

By way of example only, the conditions include a temperature and a duration. For instance, according to an exemplary embodiment, the reaction is carried out at a temperature of from about 70° C. to about 130° C., and ranges therebetween, for a duration of from about 1 hour to about 4 hours, and ranges therebetween. However, as described in detail below, these conditions can be controlled to tune the contact angle.

Step 904 represents one point in the process where localized surface contact angle modifications can be made. For instance, according to one exemplary embodiment, different portions of the surface can be contacted with different tri(m)ethoxysilane-containing solutions, i.e., having different contact angle properties—see FIG. 8, described above. To use a simple example to illustrate this concept, say for instance that in step 904 a first portion of the surface is contacted with a TMS-PPEO solution. By way of example only, this can be carried out by creating a dam around the first portion of the surface, and then placing the TMS-PPEO solution within the dam. This process is described in detail below.

Figure 9:
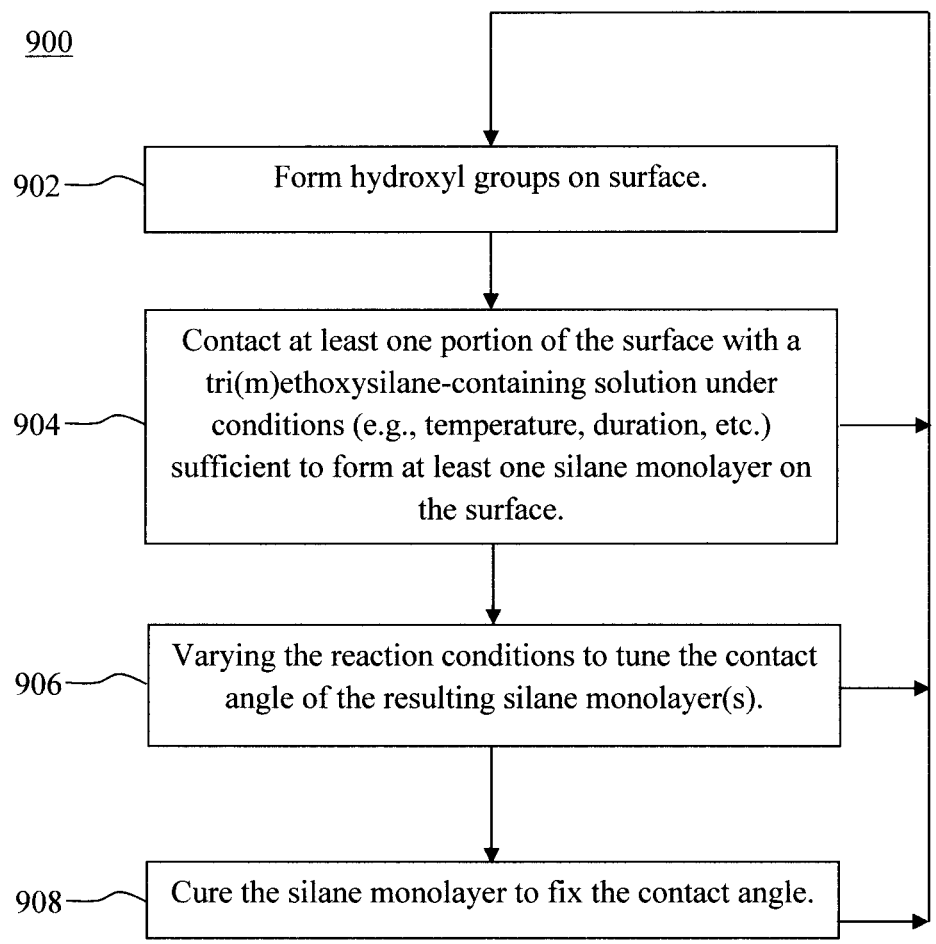
FIG. 9 is a diagram illustrating an exemplary methodology for modifying a surface for fluidic applications whereby silane derivatives are used to locally tune the contact angle and thereby control the fluid flow across the surface according to an embodiment of the present invention.

Alternatively, the given solution (e.g., the TMS-PPEO solution in this example) can be locally deposited onto only the first portion of the surface using, for example, a process such as ink jet printing, doctor blading, spin casting, slot casting, gravure printing, etc. This process is also described in detail below. As shown in FIG. 9, step 904 can be iterated multiple times. Thus, in one exemplary embodiment, step 904 is then repeated to contact a second portion of the surface with a different tri(m)ethoxysilane-containing solution (such as an HD-TES solution). Based on the use of these different solutions, the first portion and the second portion of the surface will end up being modified to have different contact angles and hence different surface flow rates.

Further, as provided above, a bare PET surface has a given contact angle. Thus, selectively contacting a portion of the PET surface with the tri(m)ethoxysilane-containing solution in step 904 (using, e.g., by placing dams, by ink jet printing, etc.) will result in the functionalized portion of the surface having different contact angles/surface flow rates as compared to the bare PET. This configuration is also considered herein to constitute selective (localized) surface contact angle modification.

According to another exemplary embodiment, at least a portion of the surface is coated with a first silane derivative (via the steps of methodology 900) and, as shown in FIG. 9, the process is repeated to locally coat at least one second silane derivative (different from the first) on top of the first silane derivative. To use a simple example to illustrate this concept, say for instance that in a first iteration of methodology 900 steps 904-906 are performed to coat the entire surface (or alternatively only a portion of the surface) with TMS-PPEO. In a second iteration of methodology 900, step 904 is repeated whereby only a portion of the TMS-PPEO-coated surface is contacted with, e.g., a HD-TES solution (for instance, by placing dams, by ink jet printing, etc.). That way, select portions of the TMS-PPEO-coated surface will have an HD-TES overlayer and thus a different contact angle/surface flow rate. The stacking of silane monolayers can be facilitated if the first layer of silane (i.e., the bottom layer or underlayer) is acrylate functional silane which can be formed, for example, by adding amine on the surface of the silane underlayer. This amine acrylate functionalization permits a second layer of silane (i.e., top layer or overlayer) to be condensed on the first. Alternatively, in step 904 a single tri(m)ethoxysilane-containing solution is contacted with the surface (or a portion thereof). In that case, the local surface contact angle modification can be carried out via other processes described herein, such as localized heating, varying the reaction conditions, curing, etc.

For instance, the tri(m)ethoxysilane-containing solution is heated to condense a silane monolayer(s) on the surface. Heating can be performed in globally (i.e., across the entire surface) or locally (of one or more specific portions of the surface). Regarding global heating for instance, as will be described in detail below, the surface (or portion thereof) can simply be immersed in a solution at a certain temperature. Alternatively, one or more local heaters and/or localized infrared (IR) radiation can be employed to locally heat portions of the surface. This global/local heating can be performed, e.g., while the surface (or portion thereof) is immersed in the tri(m)ethoxysilane-containing solution and/or after the tri(m)ethoxysilane-containing solution has been selectively deposited onto the surface (e.g., by placing dams, via ink jet printing, etc.).

This represents yet another point in the process where localized surface contact angle modifications can be made. For instance, locally heating a portion(s) of the surface while the surface is in contact with tri(m)ethoxysilane-containing solution(s) will condense the respective silane monolayer selectively on the (heated) portions of the surface. On the other hand, if the tri(m)ethoxysilane-containing solution(s) has been deposited locally onto a portion(s) of the surface (e.g., by placing dams, via ink jet printing, etc.) then heating can be performed globally to condense the silane derivative(s).

As shown in FIG. 9, the steps of methodology 900 may be performed iteratively. Thus, for example, the contacting step 904 may be performed once to form a first silane monolayer on the surface (or portion of the surface). The contacting step 904 may then be repeated to form a second silane monolayer on the surface (or a different portion of the surface), and so on.

In step 906, the reaction conditions (e.g., temperature and/or duration) are varied to tune the contact angle of the silane monolayer(s) formed on the surface. For instance, as will be described in conjunction with the description of FIG. 15 below, an increase or decrease in the reaction temperature within the above-specified range can cause a respective increase/decrease in the contact angle of the (TMS-PPEO, HD-TES or TDF-THO-TES) silane monolayer produced. To use a non-limiting example as an illustration, increasing the reaction temperature for HD-TES from 70° C. to 90° C. increases the contact angle by more than 9 degrees. Thus, the option exists for tuning the contact angle locally based on heating locally at different temperatures. For instance, the same silane derivative coated on the surface, but treated locally at different temperatures at different locations can result in different contact angles across the surface.

Figure 24:
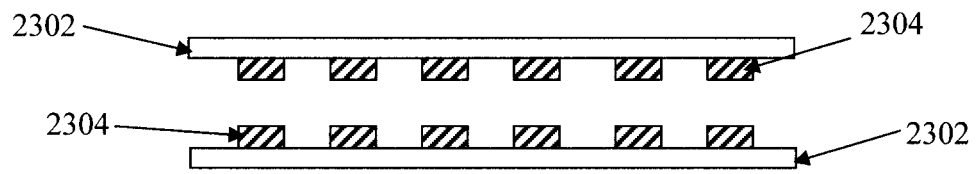
FIG. 24 is a diagram illustrating two of the hydrophilic surfaces having been placed together with two of the high contact angle dots aligned on top of one another forming a hydrophobic column that repels fluid according to an embodiment of the present invention.

Likewise, varying the duration of the reaction can also alter the contact angle of the resulting silane monolayer. For example, as will be described in conjunction with the description of FIGS. 24-26 below, an increase or decrease in the reaction duration within the above-specified range can cause a respective increase/decrease in the contact angle of the (TMS-PPEO, HD-TES or TDF-THO-TES) silane monolayer produced. Thus, according to an exemplary embodiment, in step 906 at least one of the reaction temperature and the reaction duration are varied to tune the contact angle of the silane monolayer(s).

In step 908, after the condensation of the silane monolayer, the surface is rinsed in ethanol to remove excess unreacted solution and the silane is then cured at an elevated temperature, such as from about 110° C. to about 130° C., and ranges therebetween (e.g., at about 120° C.) in nitrogen. According to an exemplary embodiment, curing is performed in step 908 by globally (i.e., across the entire surface) or locally (of one or more specific portions of the surface.

As provided above, the steps of methodology 900 may be performed iteratively. Thus, for example, the contacting (step 904), reaction condition tuning (step 906) and/or curing (step 908) may be performed once to form a first silane monolayer on the surface (or portion of the surface). These steps may then be repeated to form a second silane monolayer on the surface (or portion of the surface), and so on.

Another way to attach silane to the surface is to use UV activation whereby UV light treatment with the presence of oxygen is used to directly attach the silane monolayer to the (e.g., PET) surface. See, for example, methodology 1000 of FIG. 10.

Methodology 1000 begins in the same general manner as methodology 900 above. Thus, in step 1002 hydroxylation is used to form hydroxyl groups at the surface of the substrate. A suitable hydroxylation process was described in detail above. According to one exemplary embodiment, the hydroxylation is performed selectively on those surfaces that will receive silane modification. Alternatively, the entire surface can be treated in step 902 to permit subsequent silane modification to be performed anywhere on the (fully hydroxylated) surface. As an alternative to UV/Ozone treatment, reactive ion etching (RIE) can be used to prepare the surface for silane modification.

In step 1004, at least one tri(m)ethoxysilane-containing solution is contacted with at least a portion of at least one surface of the fluidic device. Suitable a tri(m)ethoxysilanes were provided above, e.g., trimethoxysilyl-propoxypolyethyleneoxide (TMS-PPEO), hexadecyl-triethoxysilane (HD-TES) and/or tridecafluoro-1,1,2,2-tetrahydrooctyl)triethoxysilane (TDF-THO-TES). According to an exemplary embodiment, the solution(s) include the tri(m)ethoxysilane dissolved in a solvent such as ethanol.

Step 1004 represents one point in the process where localized surface contact angle modifications can be made. For instance, according to one exemplary embodiment, different portions of the surface can be contacted with different the tri(m)ethoxysilane-containing solution is contacted with only select portions of the surface. By way of example only, as described above this can be carried out by creating a dam around the select portion(s) of the surface, and then placing the given tri(m)ethoxysilane-containing solution within the dam. Alternatively, the given tri(m)ethoxysilane-containing solution can be locally deposited onto only the select portion(s) of the surface using, for example, a process such as ink jet printing, doctor blading, spin casting, slot casting, gravure printing, etc.

In step 1006, the surface (or portion thereof) is exposed to ultraviolet (UV) radiation to form the silane monolayer(s) on the surface. The UV exposure can be localized to specific/local portions of the surface. Thus, different doses, for example different intensities and exposure times, of the UV light treatment can be applied locally to create different surface contact angle modifications. On the other hand, a global UV light treatment can be employed when the local surface contact angle modification has already been created via selective placement of the silane derivative in step 1004 (e.g., using a dam, via ink jet printing, etc.).

The dose of the UV exposure can be varied to tune the contact angle. For instance, according to one exemplary embodiment, 302 nm and 15 Watt UV lamp is used. The surface is immersed in TDF-THO-TES, and exposed to UV for 30 minutes at room temperature (e.g., from about 23° C. to about 25° C., and ranges therebetween), followed by a 2 hour cure at 120° C. Under those conditions, the contact angle of the surface changed from 60 degrees to 120 degrees.

Figure 10:
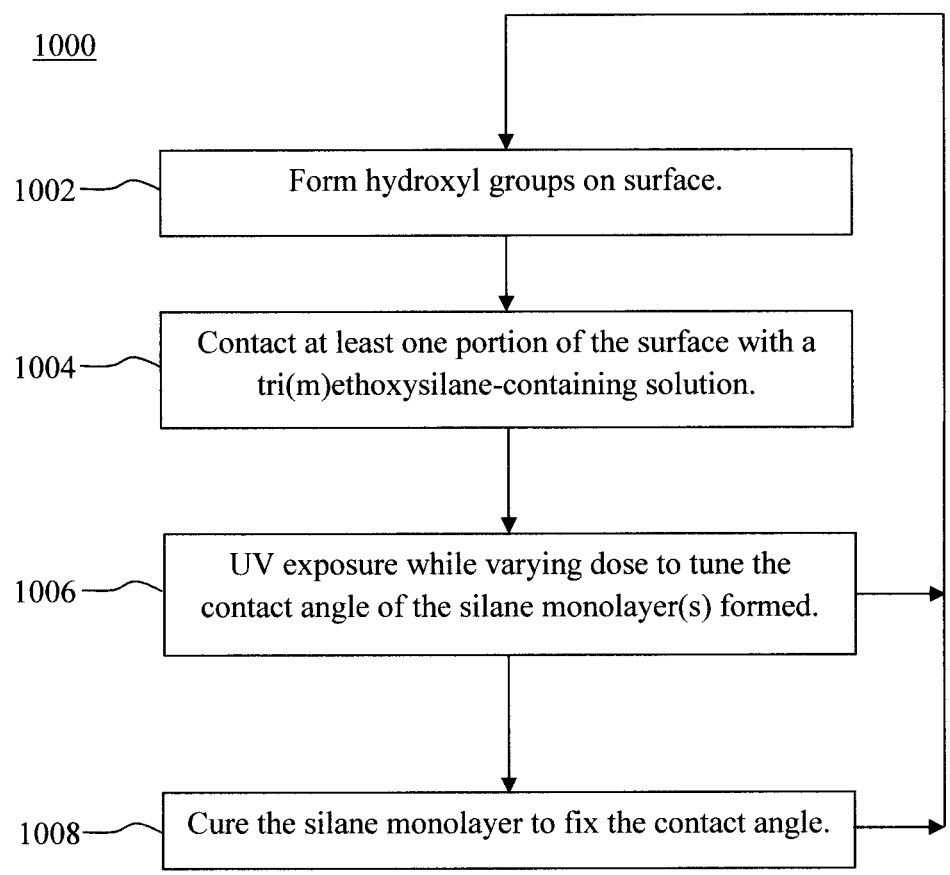
FIG. 10 is a diagram illustrating another exemplary methodology for modifying a surface for fluidic applications whereby silane derivatives are used to locally tune the contact angle and thereby control the fluid flow across the surface according to an embodiment of the present invention.

As shown in FIG. 10, after formation of the silane monolayer(s) on the surface, the process can be iterated again to form, e.g., a different silane monolayer on a different portion of the surface followed, for example, by a global cure in step 1008 (see below) to fix the contact angle. Alternatively, as shown in FIG. 10, the process can also be reiterated in this manner after the cure of step 1008 has been performed.

In step 1008, after the formation of the silane monolayer(s), the surface is rinsed in ethanol to remove excess unreacted solution and the silane is then cured at an elevated temperature, such as from about 110° C. to about 130° C., and ranges therebetween (e.g., at about 120° C.) in nitrogen. According to an exemplary embodiment, curing is performed in step 1008 by globally (i.e., across the entire surface) or locally (of one or more specific portions of the surface.

Figure 11:
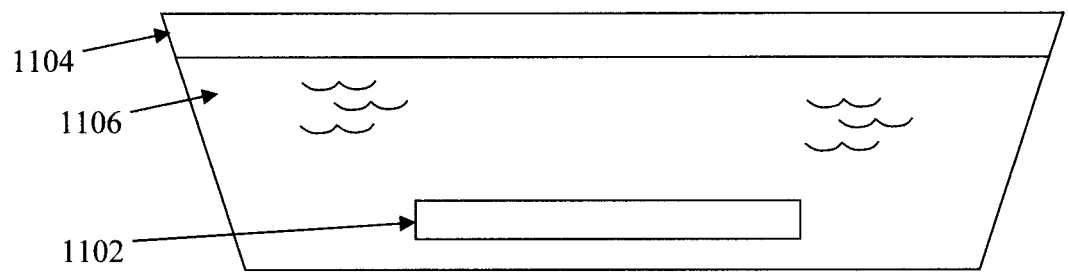
FIG. 11 is a diagram illustrating a substrate being immersed in a tri(m)ethoxysilane-containing solution according to an embodiment of the present invention.

As provided above, step 904 of methodology 900/step 1004 of methodology 1000 may be performed simply by immersing the surface (or portion thereof) in the tri(m)ethoxysilane-containing solution. This technique is shown illustrated in FIG. 11. Namely, as shown in FIG. 11, a substrate 1102 (e.g., a PET substrate) which has hydroxyl groups formed on the surface is simply placed in a vessel 1104 containing a tri(m)ethoxysilane-containing solution 1106. Heating (either locally or globally) drives the reaction to condense silane on the surface(s) of the substrate 1102, after which the substrate 1102 can be removed from the solution, rinsed, and a curing bake (to fix the contact angle) can be performed as described above.

Figure 12:
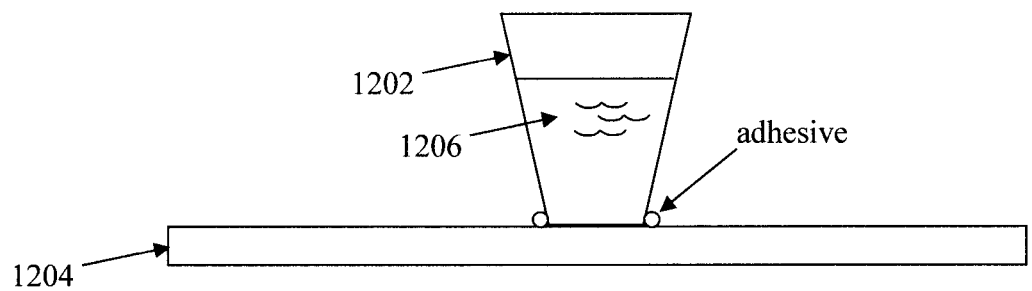
FIG. 12 is a diagram illustrating a dam structure having been built on a substrate that forms a liquid-tight seal against the surface of the substrate according to an embodiment of the present invention.

As described in conjunction with the description of step 904 of methodology 900/step 1004 of methodology 1000, above, another technique contemplated herein for local contact angle modification involves forming a dam around a portion of the surface to be functionalized. That way the dam will constrain the tri(m)ethoxysilane-containing solution to that portion of the surface. See, for example, FIG. 12. As shown in FIG. 12, a dam structure 1202 is built on a (e.g., PET) substrate 1204, surrounding a portion of the surface of the substrate 1204. The dam structure 1202 forms a liquid-tight seal against the surface of the substrate 1204. Thus, when a tri(m)ethoxysilane-containing solution 1206 is dispensed within the dam structure 1202, the dam structure 1202 constrains the tri(m)ethoxysilane-containing solution 1206 to the portion of the surface of substrate 1204 surrounded by the dam structure 1202. By way of example only, dam structure 1202 can be formed from a liquid-impermeable material such as a plastic or rubber that is attached to the surface of the substrate 1204 using an adhesive. Alternatively, another way for constructing the dam is to use a photo-definable material to build the dam at desirable locations and remove the dam after the completion of the contact angle modification.

Figure 13:
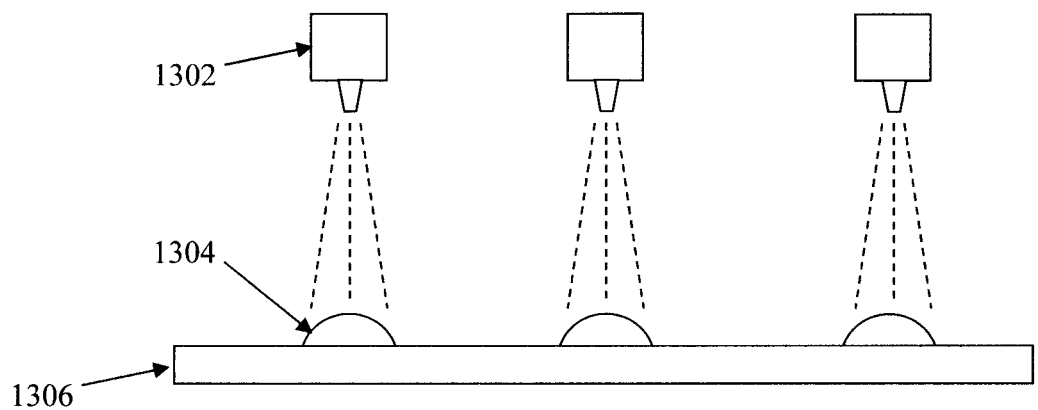
FIG. 13 is a diagram illustrating injection heads being used to deposit small amounts of tri(m)ethoxysilane-containing solution locally onto select portions of a substrate surface according to an embodiment of the present invention.

Yet another technique contemplated herein for local contact angle modification involves selectively depositing a tri(m)ethoxysilane-containing solution on a portion(s) of the surface to be functionalized. This selective deposition can be accomplished using a technique such as ink jet printing. See, for example, FIG. 13. As shown in FIG. 13, injection heads 1302 are used to deposit small amounts of tri(m)ethoxysilane-containing solution 1304 locally onto select portions of the surface of a (e.g., PET) substrate 1306.

As provided above, step 906 of methodology 900 may be performed using heaters configured to locally heat select portions of the surface. One such heater configuration contemplated herein is shown FIG. 14. The exemplary embodiment depicted in FIG. 14 involves immersing a substrate 1402 in a tri(m)ethoxysilane-containing solution 1404 contained within a vessel 1410, and selectively heating local portions of a surface of the substrate 1402 with individual local (thin film) heaters 1406 attached to the substrate. The thin film heaters 1406 might also be fabricated on the substrate 1402 by metal deposition followed by photolithography or metal deposition through a shadow mask. Optionally, the substrate 1402 maybe held against a surface which contains patterned heaters.

Figure 14:
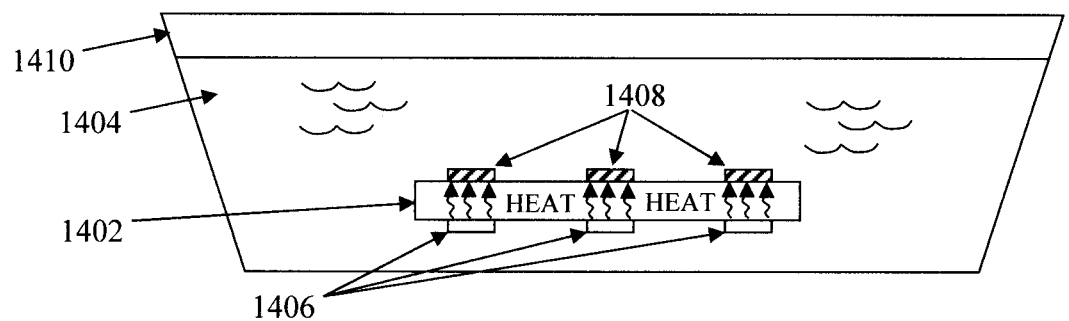
FIG. 14 is a diagram illustrating heaters being used to locally heat select portions of a substrate surface according to an embodiment of the present invention.

As shown in FIG. 14, the substrate 1402 has a first surface and a second surface opposite the first surface. The goal is to condense the silane derivative locally on select portions of the first surface. To do so, heaters 1406 are disposed on the second surface of the substrate 1402 directly opposite the select portions on the first surface. As such, heat from the heaters 1406 will be transferred from the second surface and through the substrate 1402 to the select portions on the first surface. The silane derivative 1408 will condense from the solution onto those select portions of the first surface. See FIG. 14. According to an exemplary embodiment, the heaters 1406 are resistive heating elements formed from a metal foil attached to the (second) surface of the substrate 1402.

Further, it is notable that the heaters 1406 can be set to different temperatures from one another. That way, the surface of the substrate 1402 can have local regions of differing temperature. As highlighted above, the reaction temperature can affect the contact angle of the various silane derivatives described herein. Thus, producing different local surface temperatures can effectively create regions of different contact angle across the surface.

Figure 15:
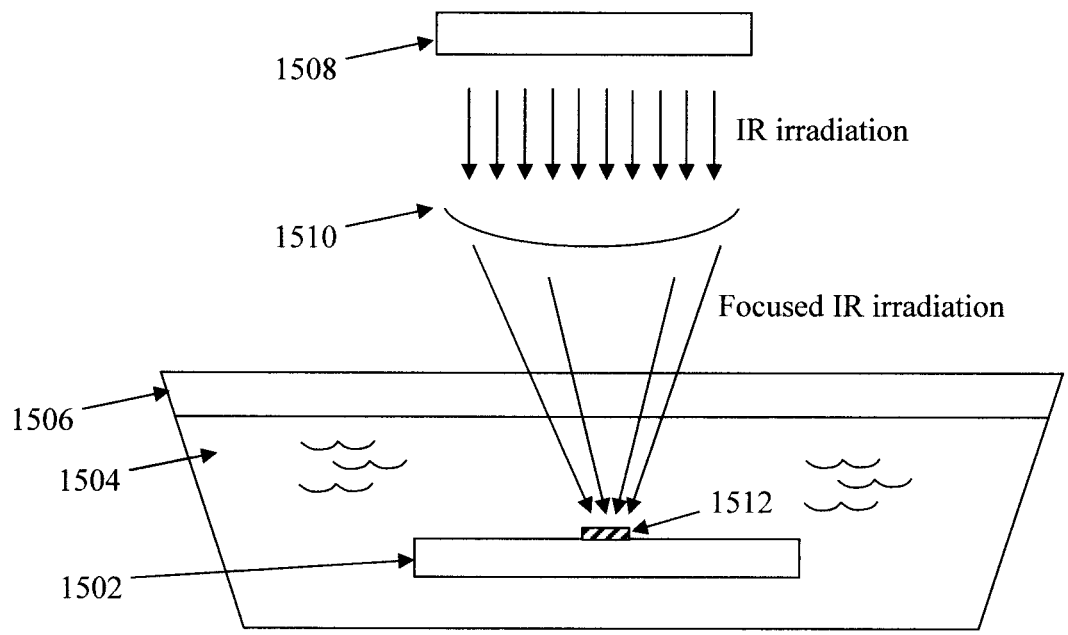
FIG. 15 is a diagram illustrating focused infrared (IR) irradiation being used to locally heat select portions of a substrate surface according to an embodiment of the present invention.

The use of heaters is only one option contemplated herein for local surface heating. For instance, as shown in FIG. 15 focused IR irradiation can be directed locally on select portions of a surface. The exemplary embodiment depicted in FIG. 15 involves immersing a substrate 1502 in a tri(m)ethoxysilane-containing solution 1504 contained within a vessel 1506, and selectively heating local portions of a surface of the substrate 1502 with IR irradiation that is generated by an IR source 1508 that is focused using a lens 1510 (such as a Fresnel lens) onto a select area(s) of the surface. Here, heating can be done on the same side of the substrate 1502 as the condensation of the silane derivative 1512.

It is notable that while FIG. 15 depicts the local heating of only a single region using the focused IR irradiation, the same process can be employed to heat multiple regions of the surface to the same or different temperatures. As provided above, the reaction temperature can affect the contact angle of the various silane derivatives described herein. Thus, by varying the IR irradiation intensity and duration at different locations, the surface of the substrate 1502 can have local regions of differing temperature. Producing these different local surface temperatures can effectively create regions of different contact angle across the surface.

FIG. 16 is a diagram illustrating the contact angle of silane derivatives based on reaction temperature. For instance, as shown in FIG. 16 when the condensation reaction of HD-TES is carried out at a temperature of 70° C., the resulting contact angle of an HD-TES-coated surface is about 88.5 degrees. However, if the reaction temperature is increased (e.g., to 90° C.) the contact angle of the HD-TES-coated surface increases to about 97.8 degrees. TDF-THO-TES exhibits a progressive increase in contact angle as the reaction temperature is raised from 70° C. to 90° C., 110° C., and 130° C. The increase in the reaction temperature probably results in an increased coverage fraction of the substrate surface by the silane monolayer, which results in the contact angle changes. The condensation of TMS-PPEO needs a minimum reaction temperature of about 110° C. However, increasing the reaction temperature from 110° C. to 130° C. increases the contact angle of a TMS-PPEO-coated surface from about 41 degrees to about 43.2 degrees.

Based on the above-described techniques, a variety of different functionalized fluidic device configurations are contemplated herein. For instance, according to an exemplary embodiment, surface chemical functionalization via silane derivatives is used to tune the contact angle of at least a portion of at least one surface of a fluidic device. In one exemplary embodiment, the surface is formed from a polymeric material 1702, such as PET with a first contact angle, and a first silane monolayer 1704 is coated (e.g., locally) on a first portion of the surface. See FIG. 17. By way of example only, the first silane monolayer (e.g., TMS-PPEO, HD-TES, or TDF-THO-TES) has a different contact angle as compared to the (bare) surface. See above where a bare PET substrate has a different contact angle from an TMS-PPEO, HD-TES, and/or TDF-THO-TES-coated PET substrate. As such, two distinct surface flow regions are now present in the fluidic device, i.e., a first region I having a contact angle of the bare surface, and a second region II having a contact angle of the first silane monolayer 1704. See FIG. 17.

Further, as shown in FIG. 17, at least one second silane monolayer 1706 can be formed (e.g., locally) on a second portion of the surface. If the second silane monolayer 1706 has a different contact angle from the (bare) surface and the first silane monolayer, then a third distinct surface flow region will now be present in the fluidic device, i.e., a third region III having a contact angle of the second silane monolayer 1706. According to an exemplary embodiment, the second silane monolayer 1706 contains a different one of TMS-PPEO, HD-TES, or TDF-THO-TES from the first silane monolayer 1704. To use a simple example, if the first silane monolayer 1704 is TMS-PPEO, then the second silane monolayer 1706 is HD-TES, or TDF-THO-TES. Alternatively, according to another exemplary embodiment, the first silane monolayer 1704 and the second silane monolayer 1706 are the same material (e.g., both are one of TMS-PPEO, HD-TES, or TDF-THO-TES), however the first silane monolayer 1704 is configured to have a different contact angle from the second silane monolayer 1706. As provided above, the contact angle can be tuned based, for example, on the reaction temperature. Thus, condensing the same silane derivative but varying the reaction temperature can be used to create the first silane monolayer 1704 and the second silane monolayer 1706 having different contact angles from one another.

In another exemplary embodiment, as above, the surface is formed from a polymeric material 1802 such as PET having a first contact angle. A first silane monolayer 1804 is coated (e.g., locally) on a portion of the surface, and a second silane monolayer 1806 is coated (e.g., locally) on top of a portion of the first silane monolayer 1804. As described above, a functional group such as an amine can be used for the condensation of the second silane layer. See FIG. 18. By way of example only, the first silane monolayer (e.g., TMS-PPEO, HD-TES, or TDF-THO-TES) has a different contact angle as compared to the (bare) surface. See above where a bare PET substrate has a different contact angle from an TMS-PPEO, HD-TES, and/or TDF-THO-TES-coated PET substrate). Further, if the second silane monolayer 1806 has a different contact angle from the (bare) surface and the first silane monolayer 1804, then there are three distinct surface flow regions present in the fluidic device, i.e., a first region I having a contact angle of the bare surface, a second region II having a contact angle of the first silane monolayer 1804, and a third region III having a contact angle of the second silane monolayer 1806.

According to an exemplary embodiment, the second silane monolayer 1806 contains a different one of TMS-PPEO, HD-TES, or TDF-THO-TES from the first silane monolayer 1804. For instance, if the first silane monolayer 1804 is TMS-PPEO, then the second silane monolayer 1806 is HD-TES, or TDF-THO-TES.

Leveraging the concept of tuning the contact angle using reaction temperature, FIG. 19 illustrates yet another exemplary embodiment contemplated herein where the contact angle is tuned locally in select portions of a given silane monolayer 1904 on a substrate 1902 to form portions 1906 of silane monolayer 1904 having a different contact angle from the rest of the layer. For instance, selectively varying the reaction temperature and/or UV dose applied to regions 1906 of monolayer 1904 can create local regions within that monolayer having a different contact angle. Thus, in the example shown illustrated in FIG. 19, this technique can be used to create distinct surface flow regions, i.e., a first region I having a contact angle of the bare (e.g., PET) surface, and second II/third III regions in the same silane monolayer 1904 but with select tuning in regions 1906. By way of example only, a blanket layer of the silane monolayer 1904 can be formed on the substrate 1902 by immersing the substrate 1902 (or portion thereof) in the respective tri(m) ethoxysilane-containing solution (see for example FIG. 11) at a given temperature to form the silane monolayer 1904 with a given contact angle. However, select regions 1906 of the monolayer can be heated to a higher temperature using, e.g., local heating elements (see for example FIG. 14) or locally focused IR irradiation (see for example FIG. 15) to tune contact angle.

The following are some non-limiting examples of microfluidic applications leveraging the present surface contact angle modification techniques.

Fluid transportation, sample filtration/separation, reagent mixing, dwelling/incubation are some of the basic functions required for a microfluidic biosensor. Flow control such as flow rate, stop, split and merge are needed to perform those functions. While the flow control can be done by active switches, passive control is desirable due to its simplicity without electrical elements. For a faster flowing fluidic channel, low contact angle and low friction is favored. However, to stop or slow down a flow, a narrow neck, a sharp angle opening to air, or a hydrophobic surface can be used.

According to an exemplary embodiment, a microfluidic device includes at least two fluidic channels, one having a faster flow rate than the other. For instance, a first one of the fluidic channels has a first flow rate R1 and a second one of the fluidic channels has a second flow rate R2, wherein R1>R2. At a certain point these fluidic channels merge such that the contents of one fluidic channel can be combined with the contents of the other. Due to the difference in flow rate through the channels, the contents of the faster flowing channel will reach the merge first. If the two fluidic channels were simply merged without any flow rate control, the flow through the faster channel might simply pinch off the slower channel, trapping an air bubble and preventing any mixing.

Figure 20:
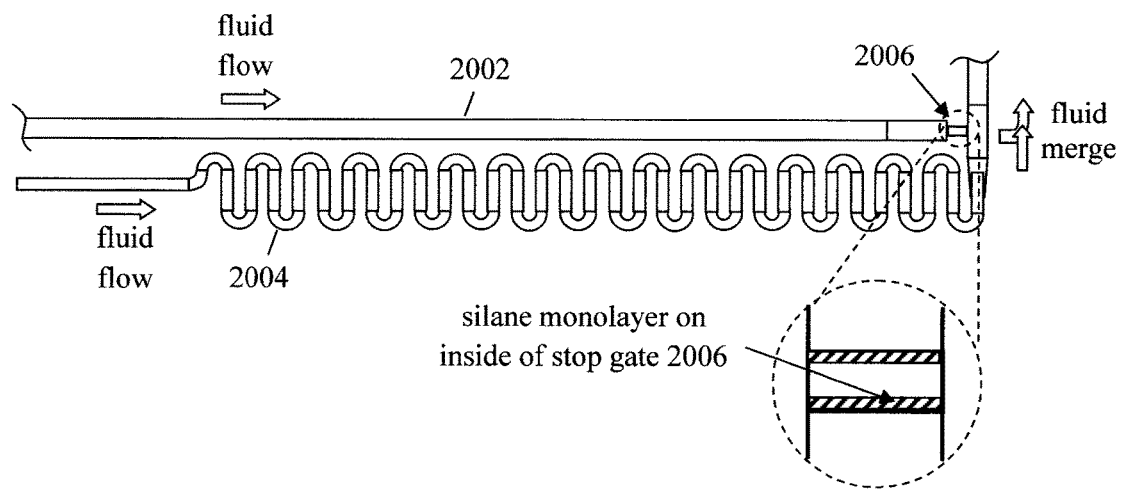
FIG. 20 is a diagram illustrating use of the present techniques to properly merge two channels having different flow rates according to an embodiment of the present invention.

In order to properly merge the two flows, a mechanism is needed to i) stop the faster flowing channel at the junction and ii) trigger the flow when the slow channel reaches the junction. FIG. 20, for example, illustrates how the present techniques can be leveraged to properly merge two fluidic channels having different flow rates. In the example shown in FIG. 20, a faster (straight) flow channel 2002 is merged with a slower (meandering) flow line 2004. The direction of fluid transport through the channels 2002 and 2004 is indicated with arrows.

The faster flow is stopped at the 90 degree stop gate 2006, until the slow flow of the meandering line reaches the pinched opening and triggers the flow from the fast flow line and the two flows merge. The duration of the stop time depends on the contact angle of the stop gate 2006. If the contact angle of the stop gate is not high enough, then the fluid arriving from the faster flow channel 2002 can leak though the stop gate 2006 before the arrival of the fluid from slower line 2004 resulting in pinch off. Therefore, as shown in FIG. 20, surface functionalization via the present techniques (see for example methodology 900 of FIG. 9/methodology 1000 of FIG. 10—described above) is used to create a low surface energy or high contact angle surface at the stop gate 2006 to ensure that the fluids from both channels 2002 and 2004 are properly merged.

Figures 21A, 21B:
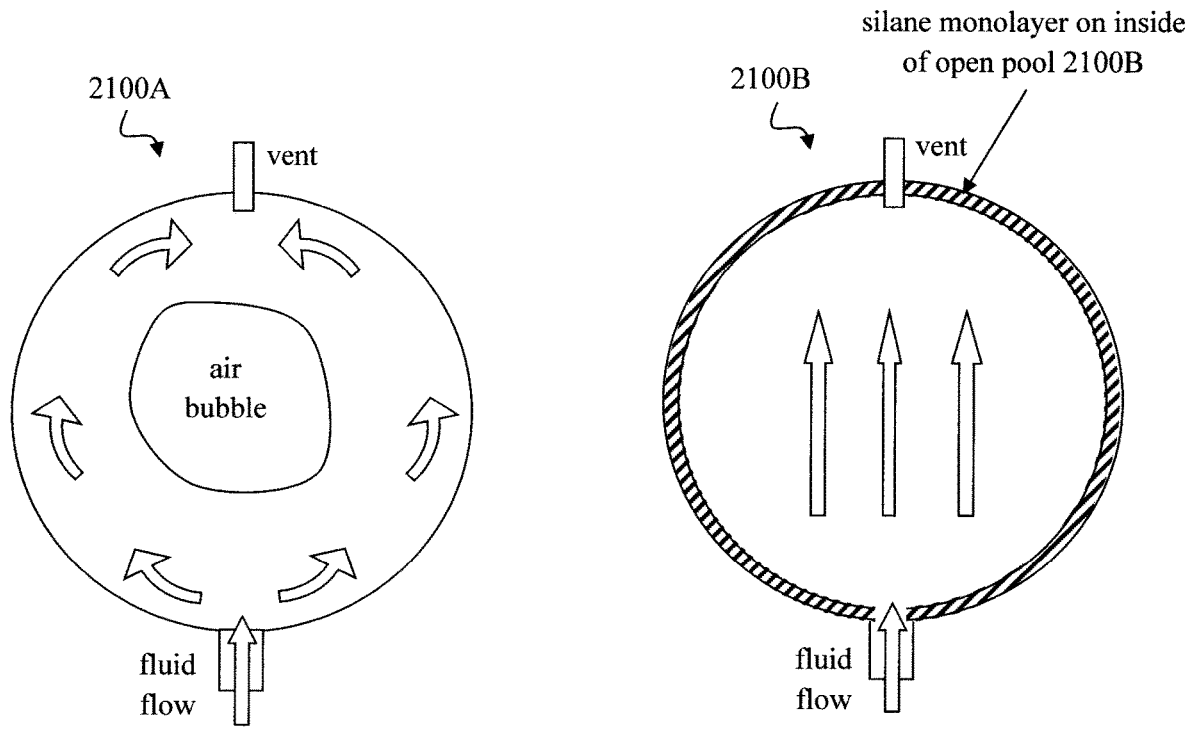
FIG. 21A is a diagram illustrating how fluids entering an open pool can fill the open pool from the edges enclosing air bubbles at the center.
FIG. 21B is a diagram illustrating use of the present techniques to create a high contact angle surface along the edges of an open pool, which slows down flow at the edges, and ensures that the open pool is evenly filled from the edges and at the center according to an embodiment of the present invention.

For reagent mixing or analyte sensing, it is desirable to have an open pool with larger surface area into which a fluid(s) can flow and mix. Thus according to another exemplary embodiment, the microfluidic device includes at least one open pool for fluid mixing. However, one potential problem with an open pool is that the flow along the edge of the open pool is faster than the flow in the center. As a result, fluids entering the open pool will fill the open pool from the edges undesirably enclosing air bubbles at the center. See FIG. 21A. Namely, as shown in FIG. 21A, fluid flowing into an open pool 2100A can have a faster flow along the edges or perimeter, causing an air bubble to form at the center. However, as shown in FIG. 21B, functionalization via the present techniques (see for example methodology 900 of FIG. 9/methodology 1000 of FIG. 10—described above) can be used to create a low surface energy or high contact angle surface along the edges of an open pool 2100B, which slows down flow at the edges, and insures that the open pool 2100B is evenly filled from the edges and at the center.

Figure 22:
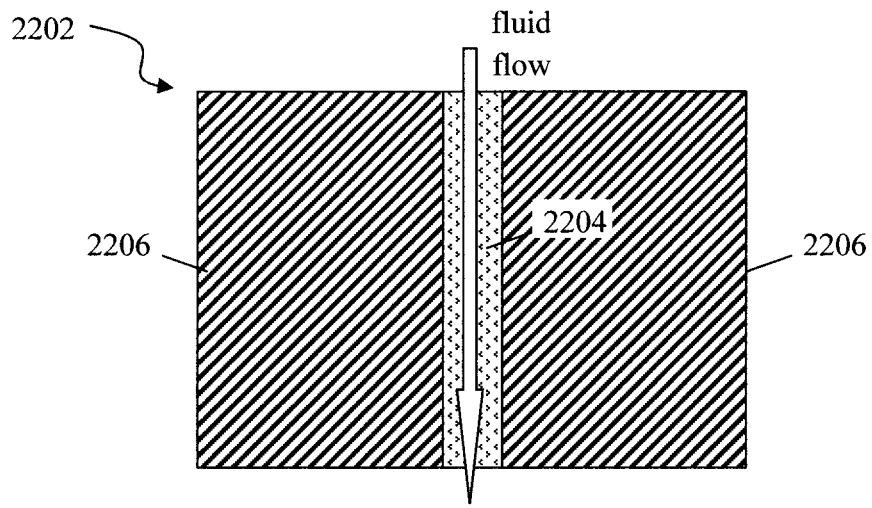
FIG. 22 is a diagram illustrating a virtual flow channel having been formed by sandwiching a low contact angle channel in between two high contact angle regions according to an embodiment of the present invention.

As provided above, the contact angle of the present silane monolayer modified surface depends on a variety of different factors, e.g., selective placement of the monolayer(s), reaction temperature, UV curing, etc. each of which can be used to locally tune the contact angle of the modified surfaces. These techniques were each described in detail above. According to another exemplary embodiment, a virtual flow channel is formed by sandwiching a low contact angle channel in between two high contact angle regions. See FIG. 22. As shown in FIG. 22, portions of a surface 2202 are modified with a first silane monolayer 2204 in between a second silane monolayer 2206. If the silane monolayer 2204 has a contact angle (CA2) that is sufficiently less than the contact angle (CA1) of silane monolayer 2206, then fluid flow across the surface 2202 will be directed along the center strip of silane monolayer 2204 essentially creating a 'virtual' channel on the surface 2202. It is notable that the silane monolayers 2204 and 2206 do not necessarily have to be different materials, but might instead be the same material which has received different localized treatments to locally tune the contact angle. Thus, the flow path can be configured using localized contact angle modifications. For instance, by way of example only, ink jet printing, localized heating (e.g., via IR irradiation), etc. can be used to control the flow, switch mixing, merging, as well as changing the flow path.

Figure 23:
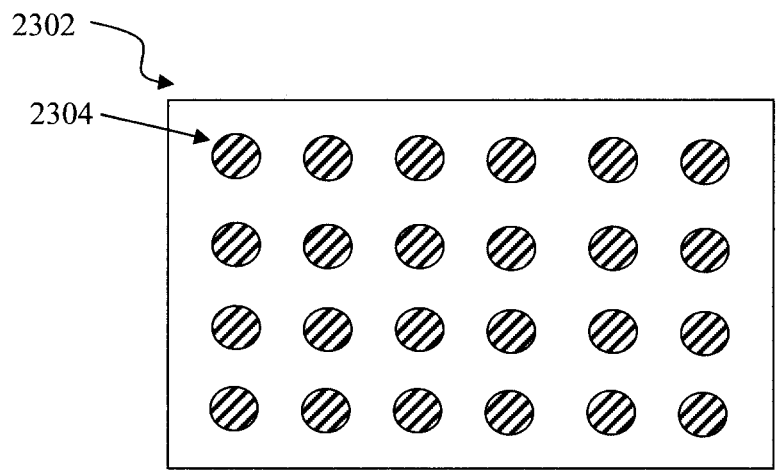
FIG. 23 is a diagram illustrating high contact angle dots having been written on a hydrophilic surface according to an embodiment of the present invention.

An exemplary implementation of this concept is shown illustrated in FIG. 23, where high contact angle dots 2304 are 'written' on a hydrophilic surface 2302. When two of these hydrophilic surfaces 2302 (such as a first and a second hydrophilic surface 2302) are placed together facing one another, two of the high contact angle dots 2304 aligned on top of one another can form a hydrophobic column that repels the fluid. See FIG. 24. This structure can act as a deterministic lateral displacement (DLD) array for particle sorting and separation of particles suspended in the fluid.

Figure 25:
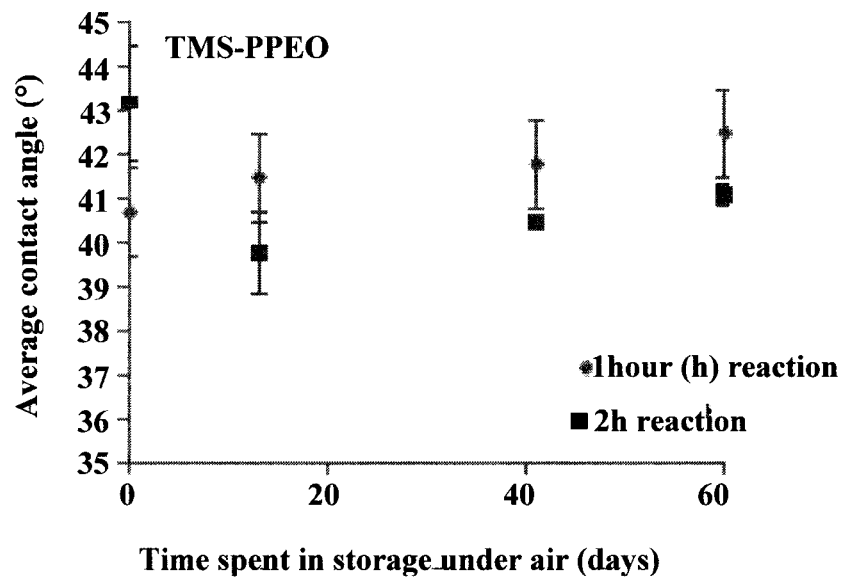
FIG. 25 is a diagram illustrating the long term stability of surface modifications made with TMS-PPEO using the present techniques according to an embodiment of the present invention.
Figure 26:
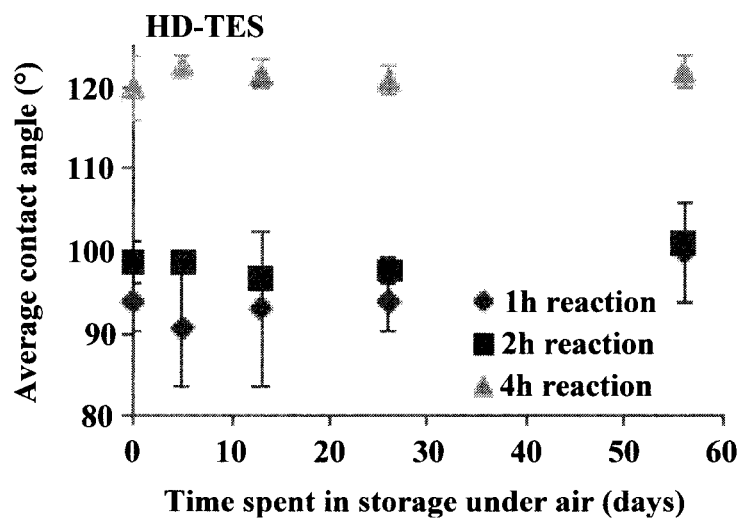
FIG. 26 is a diagram illustrating the long term stability of surface modifications made with HD-TES using the present techniques according to an embodiment of the present invention.
Figure 27:
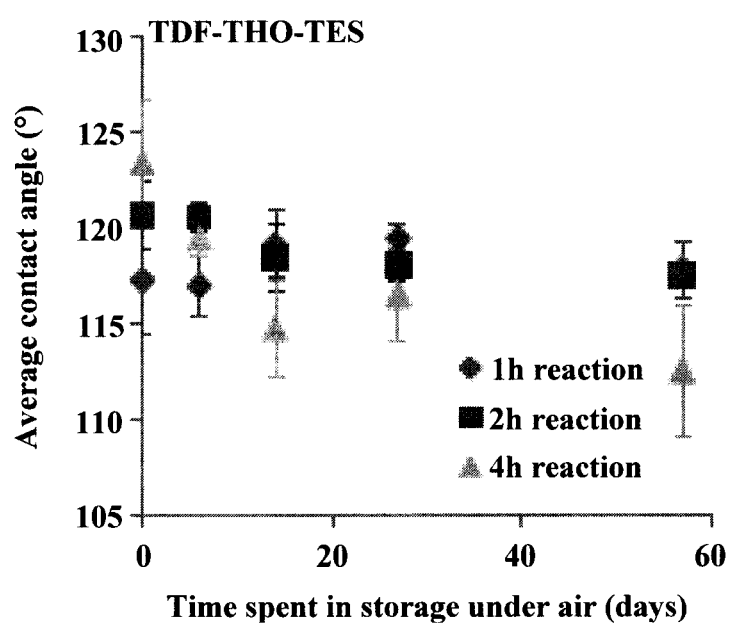
FIG. 27 is a diagram illustrating the long term stability of surface modifications made with TDF-THO-TES using the present techniques according to an embodiment of the present invention.

The long term stability of the surface modifications made using the present techniques was evaluated by measuring the contact angles of modified PET substrates that were stored under air. The results are shown in FIG. 25 (TMS-PPEO), FIG. 26 (HD-TES), and FIG. 27 (TDF-THO-TES). The reaction time is given in each plot, i.e., 1 hour (h) vs. 2 h and/or 4 h for the silane condensation step. Advantageously, the surface modifications of all the samples tested were stable for up to two months. Further, as illustrated in FIGS. 25-27, an increase in the reaction duration causes a respective increase in the contact angle of the silane monolayer produced (see initial contact angle at time 0 for TMS-PPEO, HD-TES and TDF-THO-TES reactions of duration 1 hr vs. 2 hr and 4 hr). The reverse is also true. Thus reducing the reaction time can be used to decrease the contact angle of the silane monolayer.

According to a non-limiting example, the following methods were employed to prepare sample PET substrates modified with HD-TES, TDF-THO-TES and TMS-PPEO. For modification with hexadecyl-triethoxylsilane (HD-TES), 2 centimeter (cm)×2 cm to 3 cm×3 cm PET substrates were provided (see, e.g., step 402 of FIG. 4), and sonicated in acetone for 15 minutes and blow dried. The substrates were next exposed to a UV/Ozone plasma for 15 minutes (see, e.g., step 404 of FIG. 4). The substrates were then immersed into a 10 v/v % hexadecyltriethylsilane solution in ethanol for 2 hours at 90° C. (see, e.g., step 406 of FIG. 4). The samples were next rinsed thoroughly with ethanol and cured at 120° C. for 3 hours under a nitrogen atmosphere. The samples were cooled down and the contact angle was measured: 97.8°±1.0.

For modification with tridecafluoro-1,1,2,2-tetrahydrooctyl-triethoxysilane (TDF-THO-TES), 2 cm×2 cm to 3 cm×3 cm PET substrates were provided (see, e.g., step 402 of FIG. 4), and sonicated in acetone for 15 minutes and blow dried. The substrates were next exposed to a UV/Ozone plasma for 15 minutes (see, e.g., step 404 of FIG. 4). The substrates were then immersed into a 10 v/v % tridecafluoro-1,1,2,2-tetrahydrooctyl-triethoxysilane solution in ethanol for 4 hours at 110° C. (see, e.g., step 406 of FIG. 4). The samples were next rinsed thoroughly with ethanol and cured at 120° C. for 3 hours under a nitrogen atmosphere. The samples were cooled down and the contact angle was measured: 111.4°±2.7.

For modification with trimethoxysilyl-propoxypolyethyleneoxide (TMS-PPEO), 2 cm×2 cm to 3 cm×3 cm PET substrates were provided (see, e.g., step 402 of FIG. 4), and sonicated in acetone for 15 minutes and blow dried. The substrates were next exposed to a UV/Ozone plasma for 15 minutes (see, e.g., step 404 of FIG. 4). The substrates were next immersed into trimethoxysilyl-propoxypolyethyleneoxide for 4 hours at 110° C. (see, e.g., step 406 of FIG. 4). The samples were next rinsed thoroughly with ethanol and cured at 120° C. for 3 hours under a nitrogen atmosphere. The samples were cooled down and the contact angle was measured: 41.0°±2.9.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method comprising:
   contacting at least one portion of a surface with at least one tri(m)ethoxysilane-containing solution under conditions sufficient to form at least one silane monolayer on the surface thus resulting in a modified surface having a given contact angle with a fluid flowing over the modified surface thereby modifying a flow rate of the fluid over the modified surface,
   wherein the at least one silane monolayer comprises at least one first silane monolayer resulting in the modified surface having a first contact angle CA1 with the fluid and at least one second silane monolayer resulting in the modified surface having a second contact angle CA2 with the fluid, wherein CA1 >CA2, and wherein the at least one second silane monolayer, which is coplanar with the at least one first silane monolayer, is formed on the surface in between two regions of the at least one first silane monolayer creating a fluidic channel on the surface.

2. The method of claim 1, wherein the at least one silane monolayer comprises a silane derivative selected from the group consisting of: trimethoxysilyl-propoxypolyethyleneoxide (TMS-PPEO), hexadecyl-triethoxysilane (HD-TES), tridecafluoro-1,1,2,2-tetrahydrooctyl triethoxysilane (TDF-THO-TES), and combinations thereof.

3. The method of claim 1, wherein the conditions comprise a reaction temperature and duration.

4. The method of claim 3, wherein the reaction temperature is from about 70° C. to about 130° C., and ranges therebetween.

5. The method of claim 3, wherein the reaction duration is from about 1 hour to about 4 hours, and ranges therebetween.

6. The method of claim 3, further comprising:
   varying at least one of the reaction temperature and the reaction duration to tune the given contact angle.

7. The method of claim 3, further comprising:
   locally heating only select areas of the at least one portion of the surface to the reaction temperature.

8. The method of claim 7, wherein the select areas of the at least one portion of the surface are locally heated using local heaters or focused infrared (IR) irradiation.

9. The method of claim 1, further comprising:
   forming a dam on the surface isolating the at least one portion of the surface such that the at least one tri(m)ethoxysilane-containing solution is contacted with only the at least one portion of the surface.

10. The method of claim 1, further comprising:
    forming hydroxyl groups on the at least one portion of the surface prior to performing the contacting step.

11. The method of claim 1, further comprising:
selectively depositing the at least one tri(m)ethoxysilane-containing solution onto the at least one portion of the surface.

12. The method of claim 1, wherein the at least one first silane monolayer is formed on a first portion of the surface, and wherein the at least one second silane monolayer is formed on a second portion of the surface.

13. A method comprising:
contacting at least one portion of a surface with a tri(m)ethoxysilane-containing solution;
exposing the at least one portion of the surface to ultraviolet (UV) radiation to form at least one silane monolayer on the surface thus resulting in a modified surface having a given contact angle with a fluid flowing over the modified surface thereby modifying a flow rate of the fluid over the modified surface,
wherein the at least one silane monolayer comprises a silane derivative selected from the group consisting of: TMS-PPEO, HD-TES, TDF-THO-TES, and combinations thereof, wherein the at least one silane monolayer comprises at least one first silane monolayer resulting in the modified surface having a first contact angle CA1 with the fluid and at least one second silane monolayer resulting in the modified surface having a second contact angle CA2 with the fluid, wherein CA1 >CA2, and wherein the at least one second silane monolayer, which is coplanar with the at least one first silane monolayer, is formed on the surface in between two regions of the at least one first silane monolayer creating a fluidic channel on the surface.

14. A device, comprising:
at least one silane monolayer on at least one portion of at least one surface of a material thus resulting in a modified surface having a given contact angle with a fluid flowing over the modified surface that modifies a flow rate of the fluid over the modified surface,
wherein the at least one silane monolayer comprises a silane derivative selected from the group consisting of: TMS-PPEO, HD-TES, TDF-THO-TES, and combinations thereof, and wherein the at least one silane monolayer comprises at least one first silane monolayer resulting in the modified surface having a first contact angle CA1 with the fluid and at least one second silane monolayer resulting in the modified surface having a second contact angle CA2 with the fluid, wherein CA1 >CA2, wherein the at least one second silane monolayer is formed on the surface in between two regions of the first silane monolayer creating a fluidic channel on the surface, wherein the at least one surface comprises a first surface and a second surface, wherein the at least one silane monolayer comprises dots disposed on both the first surface and the second surface, and wherein the first surface and the second surface are facing one another such that the dots are aligned into columns.

15. The device of claim 14, wherein the material comprises polyethylene terephthalate (PET).

* * * * *